United States Patent [19]

Walls

[11] Patent Number: 5,035,982

[45] Date of Patent: Jul. 30, 1991

[54] AQUEOUS DEVELOPER COMPOSITION FOR DEVELOPING NEGATIVE WORKING LITHOGRAPHIC PRINTING PLATE

[75] Inventor: John E. Walls, Fort Collins, Colo.

[73] Assignee: Eastman Kodak Company, Rochester, N.Y.

[21] Appl. No.: 379,823

[22] Filed: Jul. 14, 1989

[51] Int. Cl.$^5$ .............................................. G03F 7/32
[52] U.S. Cl. ................................ 430/331; 430/302; 430/309
[58] Field of Search .................. 430/331, 302, 309

[56] References Cited

U.S. PATENT DOCUMENTS

| | | | |
|---|---|---|---|
| 3,669,660 | 6/1972 | Golda et al. | 430/331 |
| 3,929,489 | 12/1975 | Arcesi et al. | 96/115 |
| 4,171,974 | 10/1979 | Golda et al. | 96/75 |
| 4,186,006 | 1/1980 | Kobayashi et al. | 430/331 |
| 4,339,530 | 7/1982 | Sprintschnik et al. | 430/331 |
| 4,391,897 | 7/1983 | Gracia et al. | 430/302 |
| 4,425,424 | 1/1984 | Altland et al. | 430/270 |
| 4,447,512 | 5/1984 | Rowe et al. | 430/17 |
| 4,511,640 | 4/1985 | Liu | 430/157 |
| 4,716,098 | 12/1987 | Mack et al. | 430/331 |
| 4,851,324 | 7/1989 | Hsieh et al. | 430/331 |

FOREIGN PATENT DOCUMENTS

| | | | |
|---|---|---|---|
| 1243876 | 11/1988 | Canada | 96/54 |
| 0212263 | 8/1985 | European Pat. Off. | |
| 0080042 | 1/1988 | European Pat. Off. | |
| 4629546 | 8/1971 | Japan. | |

Primary Examiner—Charles L. Bowers, Jr.
Assistant Examiner—John S. Y. Chu
Attorney, Agent, or Firm—Alfred P. Lorenzo

[57] ABSTRACT

An aqueous developing composition including
(a) a nontoxic developing vehicle which is a non-solvent for any of the components of the lithographic plate;
(b) a first surfactant comprising a sodium, lithium or potassium salt of xylene sulfonic acid;
(c) a second surfactant comprising a sodium, lithium or potassium salt of toluene, ethyl benzene, cumene or mesitylene sulfonic acid;
(d) a third surfactant comprising a sodium, lithium or potassium salt of an alkyl benzene sulfonic acid, the alkyl group containing at least 10 carbon atoms or an alkyl naphthalene sulfonic acid, the alkyl group containing from 1 to 4 carbon atoms;
(e) a cold water soluble film forming agent;
(f) an alkanol amine desensitizing agent; and
(g) an acid to control the pH of the developing composition.

33 Claims, No Drawings

AQUEOUS DEVELOPER COMPOSITION FOR DEVELOPING NEGATIVE WORKING LITHOGRAPHIC PRINTING PLATE

BACKGROUND OF THE INVENTION

1. Field of the Invention

This present invention relates to a composition for developing photosensitive coatings. More specifically, the present invention relates to a method and composition for developing lithographic printing plates and similar photographic elements. More particularly, the invention relates to aqueous developers suitable for removing the non-image area of negative-working photographic elements.

2. Description of Related Art

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

The most common type of lithographic plate to which the present invention is directed has a light sensitive coating applied to an aluminum base support. The coating may respond to light by having the portion which is exposed become soluble so that it is removed in the developing process. Such a plate is referred to as positive acting. Conversely, when that portion of the coating which is exposed becomes hardened the plate is referred to as negative acting. In both instances the image area remaining is ink receptive or oleophilic and the non-image area or background is water receptive or hydrophilic. The differentiation between image and non-image areas is made in the exposure process where a film is applied to the plate with a vacuum to insure good contact. The plate is then exposed to a light source having a portion of which is composed of UV radiation. In the instance where a positive plate is used, the area on the film that corresponds to the image on the plate is opaque so that no light will strike the plate whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light hardened surface of a negative plate is therefore oleophilic and will accept ink while the non-image which has had the coating removed through the action of a developer is desensitized and is therefore hydrophilic.

The present invention provides a new aqueous developer for negative working lithographic printing plates. Most developer compositions for negative working printing plates disadvantageously contain organic solvents which are offensive through their volatility and high concentration, pose toxic exposure hazards to the end user and are pollutants to the environment when evaporated into the air and/or discharged into public waterways. Presently there is a trend going toward aqueous developers. These aqueous developers also contain organic solvents at high concentrations which are still environmentally harmful and toxic to the end user. The prime advantage is that the solvents are not odor-wise offensive. They have the disadvantage of having a strongly alkaline pH, cause redeposit on the plate and machine parts, and solubilize the coating residue which creates disposal problems and reduces the effective life of the developer in a processing machine. The present invention provides a composition which substantially alleviates these problems.

SUMMARY OF THE INVENTION

The invention provides a developing composition which comprises an aqueous solution of (a) a nontoxic developing vehicle which is a non-solvent for any of the components of the lithographic plate;

(b) a first surfactant comprising a sodium, lithium or potassium salt of xylene sulfonic acid;

(c) a second surfactant comprising a sodium, lithium or potassium salt of toluene, ethyl benzene, cumene or mesitylene sulfonic acid, (d) a third surfactant comprising a sodium, lithium or potassium salt of an alkyl benzene sulfonic acid, the alkyl group containing at least 10 carbon atoms or an alkyl naphthalene sulfonic acid, the alkyl group containing from 1 to 4 carbon atoms;

(e) a cold water soluble film forming agent;

(f) an alkanol amine desensitizing agent; and (g) an acid to control the pH of the developing composition.

It is, therefore, an object of the present invention to provide a negative working lithographic plate developer which is an essentially neutral aqueous solution.

It is a further object of the present invention to provide a negative working lithographic plate developer which alleviates the hereinbefore mentioned problems.

These and other objects of the instant invention will be in part discussed and in part apparent upon consideration of the detailed description of the preferred embodiments.

DESCRIPTION OF THE PREFERRED EMBODIMENTS

In the production of a photographic element, a sheet substrate, preferably aluminum and the alloys thereof, especially those aluminum compositions suitable for the manufacture of lithographic printing plates such as Alcoa 3003, 1100, 1050 and CZ-17, which may or may not have been pretreated by standard graining and/or etching and/or anodizing techniques as are well known in the art, may be coated by spraying, rolling, dipping or other means with a composition suitable for use as a hydrophilizing layer for lithographic plates. Standard metal support pretreatments include graining with a thermochemical etch, mechanical abrasion and electrochemical etch, anodizing with sulfuric and/or phosphoric acids and other well known methods, which are all known to one skilled in the art. The hydrophilizing layer composition employed in the practice includes aqueous solutions of alkali silicate.

The substrate is then coated by well known means in the art with a photosensitive coating which comprises a negative working photosensitive compound such as diazo, bisazide, diazide, photomonomer or photopolymer. The coating may also contain addenda such as colorants, binder resins, stabilizers and other art recognized ingredients. After drying the coated substrate is exposed to ultraviolet radiation through a photographic mask in a known manner. The exposed photographic element is then developed to remove the non-image areas by cleaning with the developing composition provided by this invention. The developer employed is an aqueous based solution which has a pH in the range of about 4 to about 10, more preferably from about 6 to about 8 and most preferably from about 6.5 to about 7.5.

The developing composition contains a nontoxic developing vehicle that is inert with regard to any and all of the components of the lithographic plate. These developing vehicles are known in the art and are generally considered high boiling solvents with a low vapor pressure (less than 1.0 mm Hg). The vehicle is one that is not a solvent for any of the coating components and by this is meant that it will not swell, tackify, soften or otherwise alter any of the coating constituents of the plate. The vehicle is also one that is biodegradable and not toxic to humans, plants or wildlife at the concentration used. Preferred vehicles include but are not restricted to butyrolactone, phenoxy propanol, phenoxy ethanol, benzyl alcohol, methyl pyrrolidone and the like. Most preferred is benzyl alcohol. The preferred vehicle concentration ranges from about 0.5% to about 20%, more preferably from about 3% to about 15% and most preferably from about 6% to about 11% by weight.

The solution also contains a first surfactant to solubilize the vehicle used so as to provide a homogeneous solution. The first surfactant is also useful in the development process by imparting low surface tension so that the developer components may penetrate the non-exposed portions of the coating and facilitate their removal. The first surfactant is a sodium, lithium or potassium salt of xylene sulfonic acid and most preferably sodium xylene sulfonate. The first surfactant concentration ranges from about 0.25% to about 11%, more preferably from about 1.5% to about 8% and most preferably from about 3% to about 6% by weight.

The solution also contains a second surfactant to assist in the removal of the non-exposed portions of the coating. The second surfactant includes but is not restricted to the sodium, lithium or potassium salts of toluene, cumene, ethyl benzene and mesitylene sulfonic acid. The sodium salts are preferred and sodium toluene sulfonate is most preferred. The surfactant concentration ranges from about 0.1% to about 6%, preferably from about 0.75% to about 4.5% and most preferably from about 1.5% to about 3% by weight.

The solution also contains a third surfactant to facilitate the fine dispersion of removed coating particles and prevent them from aggregating into larger particles and/or prevent them from being deposited on the image or non-image areas of the plate, the rollers in the processing machine or other machine parts. The third surfactant is chosen from but not restricted to the sodium, lithium or potassium salts of an alkyl substituted benzene sulfonic acid where the alkyl group contains at least 10 carbon atoms and preferably from 10 to 22 carbon atoms or a sodium, lithium or potassium salt of an alkyl substituted naphthalene sulfonic acid where the alkyl group contains from 1 to 4 carbon atoms. The alkyl benzene sufonates are preferred. Suitable compounds for the third surfactant include the sodium, lithium and potassium salts mono-, di-, and tri- alkyl benzene and naphthalene sulfonic acids such as, for example, sodium dodecylbenzene sulfonate, potassium tridecylbenzene sulfonate, lithium dinonadecylbenzene sulfonate, sodium docosanyl benzene sulfonate, potassium methyl naphthalene sulfonate, lithium triethyl naphthalene sufonate, sodium isopropyl naphthanlene sulfonate, sodium dibutyl naphthalene sulfonate and the like. The sodium alkyl salts are preferred and most preferred is sodium dodecyl benzene sulfonate. The third surfactant concentration ranges from about 0.01% to about 3%, preferably from about 0.05% to about 1.25% and most preferably from about 0.1% to about 1% by weight.

The solution also contains a cold water soluble polymeric film forming agent that encapulates the removed coating particles thereby preventing said particles from coalescing into larger aggregates that redeposit onto the image or non-image areas of the plate or machine parts. The film former also performs as a lubricating agent for providing smooth development. By cold water soluble is meant that the polymeric film forming agent is soluble under ambient conditions. Preferred film forming agents include but are not restricted to polyvinyl pyrrolidone, polystyrene/maleic anhydride copolymers, polyvinyl alcohol, polyvinyl methyl ethers, polystyrene/vinyl acetate copolymers and the like. More preferred are polyvinyl alcohol and polyvinyl pyrrolidone. Most preferred is polyvinyl alcohol. The partially hydrolyzed polyvinyl alcohol is preferred over the fully hydrolyzed polymer. The useful molecular weight range is from about 2,000 to about 100,000, more preferred is from about 5,000 to about 60,000 and most preferred is from about 10,000 to about 35,000. The preferred film forming agent concentration ranges from about 0.1% to about 8%, more preferred from about 0.5% to about 5% and most preferred from about 1% to about 3% by weight.

The solution also contains a desensitizing agent useful for removing all light sensitive material from the background of the printing surface. The desensitizing agent also improves the rate of development and assists in precluding the formation of particles that may redeposit. Compounds having the formula

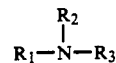

where $R_1$ is alkanol having 1 to 4 carbon atoms and $R_2$ and $R_3$ are independently chosen from hydrogen, alkyl having 1 to 4 carbon atoms or $R_1$ are suitable as densensitizing agents. Any suitable compound fitting this formula may be employed, such as, for example, monoethanolamine, diethanolamine, triethanolamine, diisopropanolamine, 2-(diisopropanolamine) ethanol, 1-amino-2-propanol, triisopropanolamine, 2-aminobutanol, N-butyldiethanolamine and the like. The preferred desensitizing agent is diethanolamine. The desensitizing agent concentration ranges from about 0.05% to about 6.0%, more preferably from about 0.1% to about 4% and most preferably from about 0.5% to about 2% by weight.

The solution further contains an effective amount of an acid to provide a pH range of from 4 to 10, preferably from 6 to 8 and most preferably from 6.5 to 7.5. The acid also optionally serves as an antioxidant. Any suitable acid or combination of acids may be used, such as, for example, citric, ascorbic, tartaric, glutaric, acetic, phosphoric sulfuric, hydrochloric and the like. The amount of acid used is determined primarily by the desired pH and the amount of desensitizer and varies from about 0.01% to about 2%, more preferred from about 0.05% to about 1.25% and most preferred from about 0.1% to about 1% by weight. The preferred acid is citric acid.

The invention is further illustrated by the following examples in which parts are by weight unless otherwise specified.

EXAMPLE 1

A developer is prepared according to the following formulation

| Ingredient | Percent |
| --- | --- |
| benzyl alcohol | 7.15 |
| sodium xylene sulfonate | 3.40 |
| sodium cumene sulfonate | 1.75 |
| sodium dodecyl benzene sulfonate | 0.35 |
| polyvinyl alcohol* | 1.85 |
| triethanolamine | 1.45 |
| phosphoric acid (85%) | 0.15 |
| water | 83.90 |
|  | 100.00 |

*the polyvinyl alcohol is Vinol 540 (aka Airvol 540) manufactured and sold by Air Products, Allentown, Pa. The developer is found to have a pH of 7.4.

A negative working aqueous plate identified as SP2992, produced by the Eastman Kodak Company, Windsor, Colo., is properly exposed with a negative mask. This plate is characterized as an aqueous processable plate which is mechanically grained, anodized in phosphoric acid and coated with a light sensitive coating in accordance with the teaching of U.S. Pat. No. 3,929,489. The plate is developed using the composition of this example by immersion and light agitation for 60 seconds. A 14 step continuous tone step wedge, wherein each step has a density difference of 0.15, and which is part of the negative mask used for exposure, is found to yield a solid 6/ghost 10 on the plate image and a solid 7/ghost 10 when inked. Such a result is preferred and would be expected from a proper developer.

EXAMPLES 2 THROUGH 8

These examples demonstrate the disadvantageous results stemming from variations made in the inventive product wherein one ingredient is excluded from the formulation given in Example 1. Table I sets forth the formulation for each of these examples.

TABLE I

| Ingredient | Ex. 2 | Ex. 3 | Ex. 4 | Ex. 5 | Ex. 6 | Ex. 7 | Ex. 8 |
| --- | --- | --- | --- | --- | --- | --- | --- |
| benzyl alcohol | — | 7.15 | 7.15 | 7.15 | 7.15 | 7.15 | 7.15 |
| Na xylene sulfonate | 3.40 | — | 3.40 | 3.40 | 3.40 | 3.40 | 3.40 |
| Na cumene sulfonate | 1.75 | 1.75 | — | 1.75 | 1.75 | 1.75 | 1.75 |
| Na dodecyl benzene sulfonate | 0.35 | 0.35 | 0.35 | — | 0.35 | 0.35 | 0.35 |
| polyvinyl alcohol | 1.85 | 1.85 | 1.85 | 1.85 | — | 1.85 | 1.85 |
| triethanolamine | 1.45 | 1.45 | 1.45 | 1.45 | 1.45 | — | 1.45 |
| phosphoric acid | 0.15 | 0.15 | 0.15 | 0.15 | 0.15 | 0.15 | — |
| water | 91.05 | 87.30 | 85.65 | 84.25 | 85.75 | 85.35 | 84.05 |
|  | 100.00 | 100.00 | 100.00 | 100.00 | 100.00 | 100.00 | 100.00 |

Example 2

The benzyl alcohol is excluded from the formulation. In like manner as described in Example 1, a plate is prepared and developed with the composition of this example. It is observed that the rate of development is extremely slow and not all of the coating is removed from the shadow areas of the image.

Example 3

The sodium xylene sulfonate is excluded from the formulation. In like manner as described in Example 1, a plate is prepared and developed with the composition of this example. It is observed that a milky mixture results which does not become clear with mixing. After several minutes of standing without stirring the mixture forms two phases. The plate developed with the milky mixture processes in a non-uniform manner wherein the coating comes off streaky and causes redeposit of the coating residue onto the image.

Example 4

The sodium cumene sulfonate is excluded from the formulation. In like manner as described in Example 1, a plate is prepared and developed with the composition of this example. It is observed that the solution is slightly cloudy but homogeneous. The developed plate has coating residue smeared over the image area. The addition of more developer and additional rubbing results in a worsening of the smearing phenomena.

Example 5

The sodium dodecyl benzene sulfonate is excluded from the formulation. In like manner as described in Example 1, a plate is prepared and developed with the composition of this example. It is observed that the coating residue forms large particles which are redeposited onto the image area. It is further observed when this composition is operating in a machine for automatically processing the plate, the particles adhere to the machine parts and particularly the rollers which in turn are applied to the plate surface.

Example 6

The polyvinyl alcohol is excluded from the formulation. In like manner as described in Example 1, a plate is prepared and developed with the composition of this example. It is observed that the coating removed forms particles that adhere to the background and image.

Example 7

The triethanolamine is excluded from the formulation. In like manner as described in Example 1, a plate is prepared and developed with the composition of this example. It is observed that the rate of development is slowed and the particles removed are larger. Further, it requires more time to fully desensitize the background.

Example 8

The phosphoric acid is excluded from the formulation. In like manner as described in Example 1, a plate is prepared and developed with the composition of this example. It is observed that although the developer adequately develops the plate, the pH is 10.78 which is not as preferred as a more neutral pH for environmental purposes. There is also an offensive amine odor.

EXAMPLES 9 THROUGH 15

The following seven examples demonstrate the results stemming from variations made in the inventive product. The ingredients are interchanged within the teachings of the instant invention as set forth in Table II. Although there were slight differences in rate of development, all results are favorable and would be considered to be that expected from a preferred developer. The results of Examples 9 through 15 show the interchangeability of components and the latitude of the formulation.

TABLE II

| Ingredient | Ex. 9 | Ex. 10 | Ex. 11 | Ex. 12 | Ex. 13 | Ex. 14 | Ex. 15 |
| --- | --- | --- | --- | --- | --- | --- | --- |
| benzyl alcohol | 9.17 | — | 8.56 | — | — | 10.54 | 6.79 |
| phenoxy propanol | — | 7.27 | — | 5.15 | 8.11 | — | — |
| Na xylene sulfonate | 5.77 | 3.30 | 4.38 | 3.30 | 4.12 | 7.23 | 4.85 |
| Na toluene sulfonate | — | 1.78 | 2.35 | — | 4.12 | 4.32 | — |
| K cumene sulfonate | 4.45 | — | — | 2.68 | — | — | 1.25 |
| Na dodecyl benzene sulfonate | 0.13 | — | 0.90 | — | 1.08 | 0.87 | — |
| Na isopropyl naphthalene sulfonate | — | 1.21 | — | 0.45 | — | — | 0.62 |
| polyvinyl pyrrolidone | 2.67 | — | — | 0.83 | — | 1.39 | — |
| polyvinyl alcohol | — | 1.84 | 1.41 | — | 2.38 | — | 1.94 |
| diethanolamine | — | 0.95 | 1.03 | — | — | 1.77 | 2.04 |
| 2-(diisopropylamino)ethanol | 2.61 | — | — | 1.55 | 2.22 | — | — |
| citric acid | 1.34 | — | 0.60 | — | 0.91 | 0.72 | — |
| acetic acid | — | 0.46 | — | 0.82 | — | — | 1.07 |
| water | 73.86 | 83.19 | 80.77 | 85.22 | 77.06 | 73.16 | 81.44 |
|  | 100.00 | 100.00 | 100.00 | 100.00 | 100.00 | 100.00 | 100.00 |

Example 16

An A-60 plate (presensitized negative plate, manufactured and sold by the Printing Product Division (Enco) of Hoechst Celanese Corporation) is hand processed using the developer of Example 15. The background coating is easily removed with no evidence of redeposit. In addition, the application of a vigorous inking test shows a hydrophilic background not prone to scumming and a fully inked image.

Example 17

A Vistar XLR plate (presensitized negative plate, manufactured and sold by Polychrome Corporation) is hand processed using the developer of Example 14. The background coating is easily removed with no evidence of redeposit. In addition, the application of a vigorous inking test shows a hydrophilic background not prone to scumming and a fully inked image.

Example 18

A FND plate (presensitized negative plate, manufactured and sold by Fuji Photo Film Company) is hand processed using the developer described in Example 11. The background coating is easily removed with no evidence of redeposit. In addition, the application of a vigorous inking test shows a hydrophilic background not prone to scumming and a fully inked image.

It is to be understood that various changes in the details, steps, materials and arrangement of parts, which have been herein described and illustrated in order to explain the nature of the invention, may be made by those skilled in the art within the principle and scope of the invention as defined in the appended claims and their equivalents.

What is claimed is:

1. An aqueous developing composition capable of removing the unexposed portion of a lithographic printing plate having a polymeric binder in a negative working element which comprises
    (a) from about 0.5 to about 20 percent by weight of nontoxic developing vehicle, said vehicle being a nonsolvent for any of the components of the lithographic plate;
    (b) from about 0.25 to about 11 percent by weight of a first surfactant comprising a sodium, potassium or lithium salt of xylene sulfonic acid;
    (c) from about 0.1 to about 6 percent by weight of a second surfactant comprising a sodium, potassium or lithium salt of toluene sulfonic acid, ethyl benzene sulfonic acid, cumene sulfonic acid or mesitylene sulfonic acid;
    (d) from about 0.01 to about 3 percent by weight of a third surfactant comprising a sodium, potassium or lithium salt of an alkyl substituted benzene sulfonic acid where the alkyl group contains at least 10 carbon atoms or a sodium, potassium or lithium salt of an alkyl substituted naphthalene sulfonic acid where the alkyl group contains from 1 to 4 carbon atoms;
    (e) from about 0.1 to about 8 percent by weight of a cold water soluble polymeric film forming agent;
    (f) from about 0.05 to about 6 percent by weight of a desensitizing agent having the formula

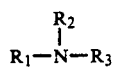

where $R_1$ is alkanol having 1 to 4 carbon atoms and $R_2$ and $R_3$ are independently chosen from hydrogen, alkyl having 1 to 4 carbon atoms or $R_1$; and
    (g) an effective amount of an acid to bring the pH of the aqueous developing composition to from about 4 to about 10; the balance water.

2. The aqueous developing composition of claim 1 wherein the nontoxic developing vehicle is benzyl alcohol, butylolactone, phenoxypropanol, phenoxy ethanol or methylpyrrolidone.

3. The aqueous developing composition of claim 2 wherein the developing vehicle is benzyl alcohol.

4. The aqueous developing composition of claim 1 wherein the developing vehicle is present in the amount of from about 3 to about 15 percent by weight.

5. The aqueous developing composition of claim 1 wherein the developing vehicle is present in the amount of from about 6 to 11 percent by weight.

6. The aqueous developing composition of claim 1 wherein the first surfactant is present in the amount of from about 1.5 to about 8 percent by weight.

7. The aqueous developing composition of claim 1 wherein the first surfactant is present in the amount of from about 3 to about 6 percent by weight.

8. The aqueous developing composition of claim 1 wherein the second surfactant is sodium toluene sulfonate.

9. The aqueous developing composition of claim 1 wherein the second surfactant is present in the amount of from about 0.75 to about 4.5 percent by weight.

10. The aqueous developing composition of claim 1 wherein the second surfactant is present in the amount of from about 1.5 to about 3 percent by weight.

11. The aqueous developing composition of claim 1 wherein the third surfactant is a sodium, potassium or lithium salt of an alkyl substituted benzene sulfonic acid where the alkyl group has 10 to 22 carbon atoms.

12. The aqueous developing composition of claim 1 wherein the third surfactant is a sodium, potassium or lithium salt of an alkyl substituted naphthalene sulfonic acid where the alkyl group has 1 to 4 carbon atoms.

13. The aqueous developing composition of claim 1 wherein the third surfactant is sodium dodecyl benzene sulfonate.

14. The aqueous developing composition of claim 1 wherein the third surfactant is present in the amount of from about 0.05 to about 1.25 percent by weight.

15. The aqueous developing composition of claim 1 wherein the third surfactant is present in the amount of from about 0.1 to 1 percent by weight.

16. The aqueous developing composition of claim 1 wherein the cold water soluble polymeric film forming agent is polyvinyl alcohol, polyvinyl pyrrolidone, polystyrene-maleic anhydride copolymer, polyvinyl methyl ether or polysytrene-vinyl acetate copolymer.

17. The aqueous developing composition of claim 16 wherein the film forming agent has a molecular weight of from about 2000 to about 100,000.

18. The aqueous developing composition of claim 17 wherein the film forming agent has a molecular weight of from about 5000 to about 60,000.

19. The aqueous developing composition of claim 17 wherein the film forming agent has a molecular weight of from about 10,000 to about 35,000.

20. The aqueous developing composition of claim 1 wherein the film forming agent is present in the amount of from about 0.5 to 5 percent by weight.

21. The aqueous developing composition of claim 1 wherein the film forming agent is present in the amount of from about 1 to about 3 percent by weight.

22. The aqueous developing composition of claim 16 wherein the film forming agent is polyvinyl alcohol.

23. The aqueous developing composition of claim 16 wherein the film forming agent is polyvinyl pyrrolidone.

24. The aqueous developing composition of claim 1 wherein at least one of the groups $R_2$ or $R_3$ of the desensitizing agent is alkanol.

25. The aqueous developing composition of claim 1 wherein the desensitizing agent is an ethanolamine.

26. The aqueous developing composition of claim 25 wherein the desensitizing agent is diethanolamine.

27. The aqueous developing composition of claim 1 wherein the desensitizing agent is present in an amount of from about 0.1 to about 4 percent by weight.

28. The aqueous developing composition of claim 1 wherein the desensitizing agent is present in an amount of from about 0.5 to about 2 percent by weight.

29. The aqueous developing composition of claim 1 wherein the acid is employed in an amount to bring the pH of the aqueous developing composition to from about 6 to about 8.

30. The aqueous developing composition of claim 1 wherein the acid is employed in an amount to bring the pH of the aqueous developing composition to from about 6.5 to about 7.5.

31. The aqueous developing composition of claim 1 wherein the developing vehicle is benzyl alcohol, the first surfactant is sodium xylene sulfonate, the second surfactant is sodium toluene sulfonate, the third surfactant is sodium dodecyl benzene sulfonate, the cold water soluble film forming agent is polyvinyl alcohol or polyvinyl pyrrolidone, the desensitizing agent is diethanolamine and the acid is citric acid.

32. The aqueous developing composition of claim 31 wherein the pH is from about 6 to about 8.

33. A process for developing a negative working lithographic plate having a light-sensitive coating comprising applying to the surface of a lithogaphic plate a developing composition in accordance with claim 1, distributing said developing composition over the surface of the plate to remove the unexposed portions of the light-sensitive coating and rinsing the plate with water to remove the developing composition and coating residue.

* * * * *